(12) United States Patent
Hsu et al.

(10) Patent No.: US 9,035,378 B2
(45) Date of Patent: May 19, 2015

(54) TRENCH POWER MOSFET STRUCTURE FABRICATION METHOD (71) Applicant: SUPER GROUP SEMICONDUCTOR CO., LTD., New Taipei City (TW)

(72) Inventors: Hsiu-Wen Hsu, Hsinchu County (TW); Chun-Ying Yeh, Hsinchu (TW); Yuan-Ming Lee, Taichung (TW)

(73) Assignee: SUPER GROUP SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 14/257,999

(22) Filed: Apr. 21, 2014

(65) Prior Publication Data
US 2014/0349456 A1 Nov. 27, 2014

Related U.S. Application Data (62) Division of application No. 14/025,811, filed on Sep. 12, 2013, now Pat. No. 8,872,266.

(30) Foreign Application Priority Data

May 24, 2013 (TW) .............................. 102118533 A (51) Int. Cl.
H01L 21/762 (2006.01)
H01L 29/66 (2006.01)
H01L 29/78 (2006.01)

(52) U.S. Cl.
CPC .... *H01L 29/66666* (2013.01); *H01L 21/76237* (2013.01); *H01L 29/7827* (2013.01)

(58) Field of Classification Search
USPC .................................. 257/334, 487, 331, 270
See application file for complete search history.

(56) References Cited

U.S. PATENT DOCUMENTS

2012/0098055 A1* 4/2012 Darwish et al. ............... 257/330

* cited by examiner

*Primary Examiner* — Marc Armand
(74) *Attorney, Agent, or Firm* — CKC & PARTNERS CO., LTD.

(57) ABSTRACT

A trench power MOSFET structure and fabrication method thereof is provided. The fabrication method comprises following process. First, form an isolating trench. Then, form at least two doped regions around the isolating trench. The doped regions are adjacent and the doping concentrations of two doped regions are different. Form an isolating structure in the isolating trench. Wherein, the junction profiles of the two doped regions are made by on implantation method for moderate the electric field distribution and decreasing the conduction loss.

6 Claims, 8 Drawing Sheets

TRENCH POWER MOSFET STRUCTURE FABRICATION METHOD

RELATED APPLICATIONS

The present application is a Divisional Application of the application Ser. No. 14/025,811, filed Sep. 12, 2013, the entire contents of which are hereby incorporated herein by reference, which claims priority to Taiwan Application Serial Number 102118533, filed May 24, 2013, all of which are herein incorporated by reference.

BACKGROUND

1. Technical Field

The present disclosure relates to a trench power MOSFET structure and the fabrication method thereof in particular to the trench power MOSFET structure with the two doped regions which's junction profiles are made repeatedly by ion implantation processes.

2. Description of Related Art

In the power MOSFET application filed, the voltages withstanding capability and low impedance characteristics are the MOSFET important capability indices. In the traditional fabrication method, the junction profile could not be controlled and therefore it could not to manufacture the power MOSFET with better voltages withstanding capability and low impedance characteristics.

SUMMARY

The present disclosure provides a fabrication method of the trench power MOSFET structure, which comprises follow steps. First, form an isolating trench, and then form two doped regions which's dopant concentration are different to each other, wherein, the two doped regions are connected to each other and around outward the trench. Next, form an isolating structure in the isolating trench.

According to one exemplary embodiment of the present disclosure, before the step of thrilling the isolating trench, further comprises forming an epitaxial layer; next, forming a gate trench in the epitaxial layer; then, forming a gate structure in the gate trench; thereafter, forming a body region around outward the gate structure and the isolating trench locating outside the body region.

According to one exemplary embodiment of the present disclosure, the steps of forming the isolating trench and the two doped regions comprise follow steps. First, form a first isolating trench. Then, form a first doped region located outside the first isolating trench. Next, etch the first doped region located in the bottom of the first isolating trench for forming a second isolating trench. Finally, form a second doped region located outside the second isolating trench.

According to one exemplary embodiment of the present disclosure, the cross-section area of the first isolating trench is larger than that of the second isolating trench.

According to one exemplary embodiment of the present disclosure, the two doped regions are formed in the different locations by the ion implantation with different angles.

According to one exemplary embodiment of the present disclosure, the concentrations of the two doped regions are light to heavy from the top down.

To sum up, an exemplary embodiment of the present disclosure provides a trench power MOSFET structure and fabrication method thereof. In which repeat to fabricate the junction profile outward around the trench. Through controlling the amount of the implanted ions changes the width of the junction profile in design need. As the MOSFET is operated in reversed voltage, the electric potential is utilized to form the charge balance and reduced surface electric filed effect (RESURF). Accordingly, the moderate electric filed would be formed in the trench and the side surface of the trench. Consequently, utilize less space to obtain the property of the higher electric potential integration and less conduction loss (RON). Meanwhile, through the principle optimize the impedance and thickness of the epitaxial layer to decrease the conduction loss effectively and further reduce the conduction loss of the device.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

The main technique characteristic of present disclosure is to manufacture repeatedly at least two doped regions connecting to each other for forming the junction profile around the side wall of the trench. The junction profile can be controlled by the mounts of the ion implantations (dopant concentration) and the width of the junction profile is also defined. It can form the moderate electric field distribution in the trench and around the side wall of the trench to reduce effectively the conduction loss of the device. The design of the present disclosure can be applied to the trenches in the active region or termination region by controlling the dopant concentrations to form the junction profiles for achieving efficiently voltage withstanding capability and low impedance characteristics.

FIG. 1A to FIG. 1J shows the fabrication method of the trench power MOSFET structure in accordance to an exemplary embodiment of present disclosure. This embodiment shows the application in the active region, but it's not limited there. For example, it can also be used in the trench located in the two sides or around termination region.

Figure 1A:
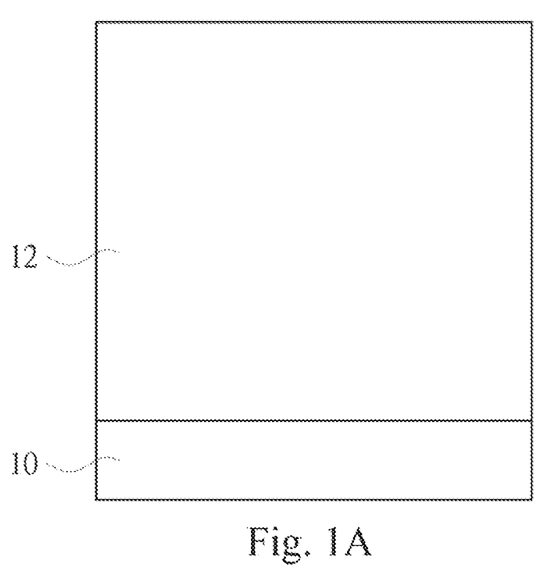
FIG. 1A~1J show a fabrication method of a trench power MOSFET structure in accordance to an embodiment of the present disclosure.
Figure 1B:
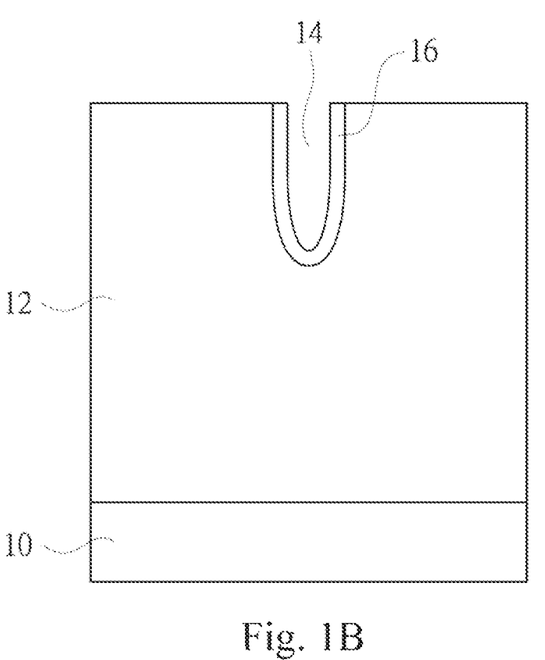
Figure 1C:
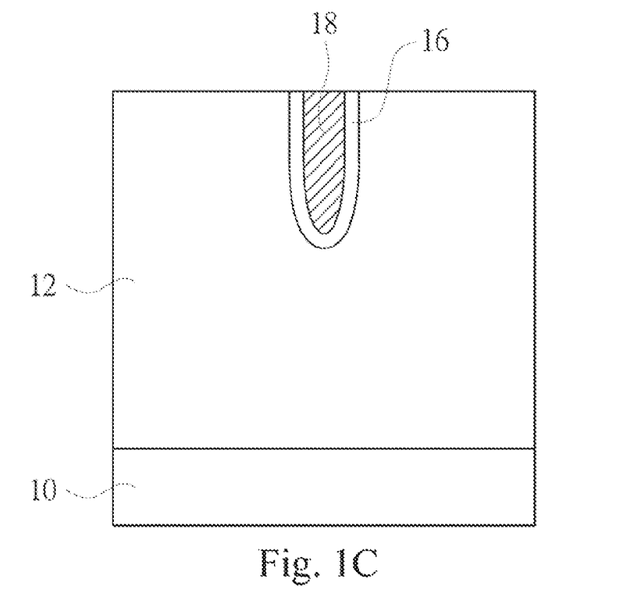

First, as shown in FIG. 1A, form an epitaxial layer 12 on the substrate 10. Then, a gate trench 14 is formed in the epitaxial layer 12 in the FIG. 1B, and form a gate dielectric layer 16 on the inner side of the gate trench 14. Thereafter, as shown in the FIG. 1C, form a gate structure 18 in the gate trench 14. In this process, e.g., poly silicon is deposited in the gate trench 14 and on the epitaxial layer 12. Then, the poly silicon on the epitaxial layer 12 is removed through etch back process and the poly silicon in the gate trench 14 is remained to form the gate structure 18 in the gate trench 14.

Figure 1D:
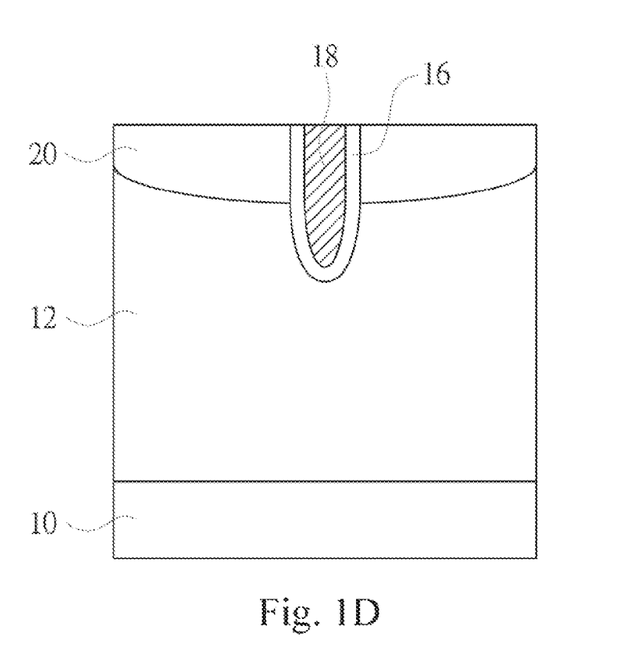
Figure 1E:
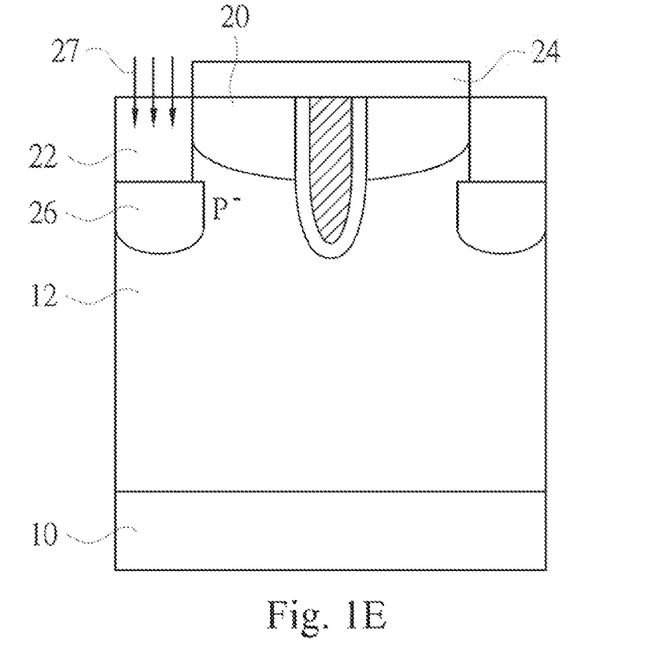

Next, as shown in the FIG. 1D, form a body region 20 surrounding the gate structure 18. The body region 20 is formed through ion implantation method, and the conductive type (ex. P-type) of the body region 20 is different from the conductive type (ex. N-type) of the epitaxial layer 12. Then, as shown in FIG. 1E, form a first isolating trench 22 outside the body region 20. The first isolating trench 22 can be formed as follow example. First, form a mask layer 24 covering the gate structure 18 and the body region 20. Then, etch the body region 20 to form the first isolating trench 22. Thereafter, the dopant with a first concentration (P−) is implanted to the epitaxial layer 12 by ion implantation method through first isolating trench 22 for forming the first doped region 26. Then, drive in the first doped region 26 as the direction of the down arrow 27, the first doped region 26 (P−) would diffuse to up and down, right and left. The first doped region 26 is diffused to surround the first isolating trench 22. The surrounding region of the first isolating trench 22 is on the bottom and side adjacent to bottom.

Figure 1F:
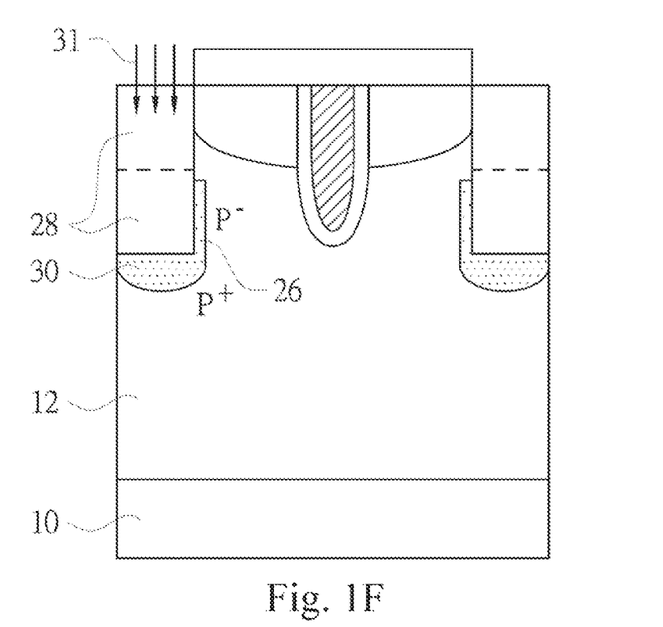

Next, as shown in the FIG. 1F, etch downward the P-type first doped region 26 through the first isolating trench 22, or further etch to the epitaxial layer 12 to expand first isolating trench 22 to second isolating trench 28. Then, ion implantation with different dopant concentration is implemented again. For example, the dopant with second concentration (P+) is implanted to epitaxial layer 12 for forming the second doped region 30. The second concentration is different from the first concentration. Then, as the direction of the down arrow 31, drive in the second doped region 30 (P+). The second doped region 30 (P+) diffuses up and low, right and down to surround the second isolating trench 28. The surrounding region is on the bottom and side adjacent to the bottom of the second isolating trench 28.

Figure 1G:
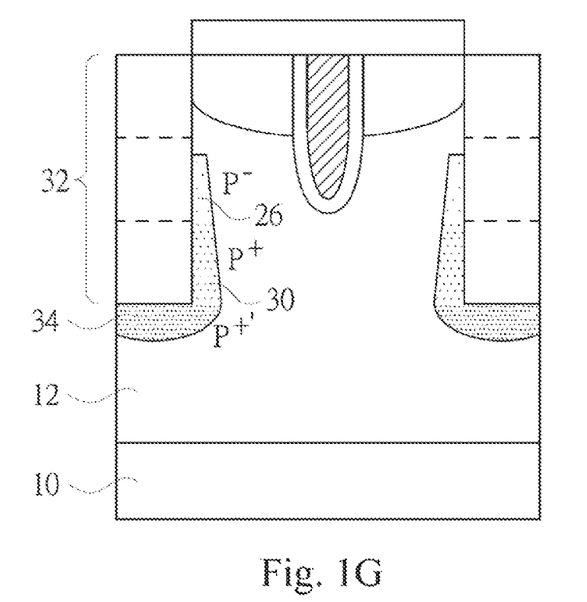

Thereafter, as shown in FIG. 1G, etch down the P+ second doped region 30 through the second isolating trench 28 or further etch to the epitaxial layer 12 to expand the second isolating trench 28 to the third isolating trench 32. Then, ion implantation with different dopant concentration is used. For example, the dopant with third concentration (P+') is implanted to form the third doped region 34 by ion implantation method. Wherein, the dopant concentration of the third doped region 34 could be adopted the same or larger than that of the second concentration (P+). Then, as the direction of the down arrow 31, drive in the third doped region 34. The third doped region 34 (P+') diffuses up and low, right and down to surround third isolating trench 32. The surrounding region is on the bottom and side adjacent to the bottom of the third isolating trench 32.

Figure 1H:
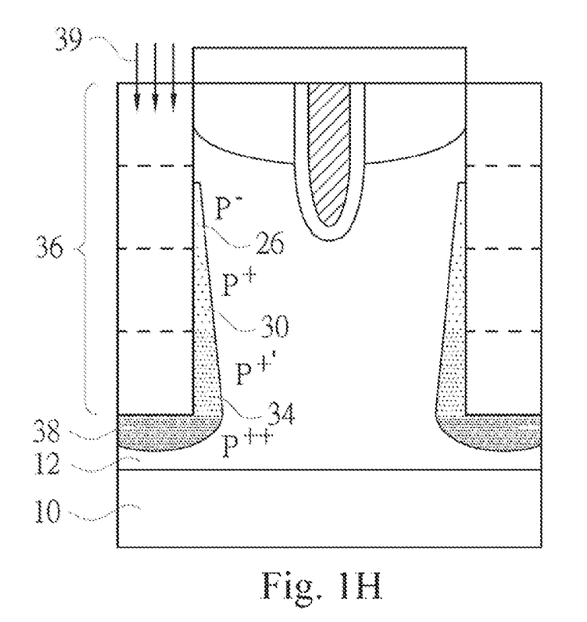

Next, as shown in FIG. 1H, etch down the P+' third doped region 34 through third isolating trench 32 or further etch to the epitaxial layer 12 to expand the third isolating trench 32 to the fourth isolating trench 36. Then, ion implantation with different dopant concentration is used. For example, the dopant with fourth concentration (P++) is implanted to form the fourth doped region 38 by ion implantation method. Wherein, the dopant concentration of the fourth doped region 38 could be adopted the larger than that of the fourth concentration (P++). Then, as the direction of the down arrow 39, drive in the fourth doped region 38. The fourth doped region 38 (P++) diffuses up and low, right and down to surround fourth isolating trench 36. The surrounding region is on the bottom and side adjacent to the bottom of the fourth isolating trench 36.

Figure 1I:
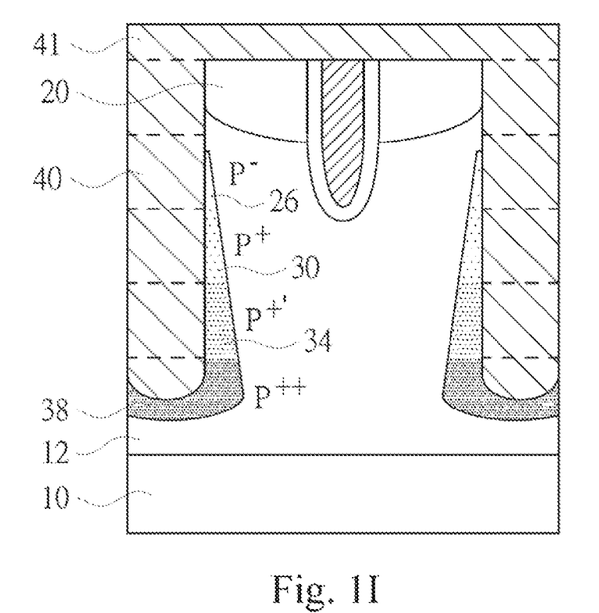

Thereafter, as shown in FIG. 1I, form an isolating structure 40 in the fourth isolating trench 36. Wherein, for example, the isolating structure 40 is composed of the oxide layer. Next, as shown in the FIG. 1J, source regions 42 are formed in the body region 20 respectively. The oxide layer 46 is formed on the N+ source region 42 and the gate structure 18. The heavy doped region 48 (e.g., P++) is formed in the body region and is adjacent to the N+ source region 42 and isolating structure 40. The metal layer 44 is formed on the isolating structure 40, heavy doped region 48 and the oxide layer 46. The forming process is as following; first, etch the up portion of the oxide layer 41 in the FIG. 1I. Then, N+ source region 42 is formed in the body region 20 through ion implantation method. Thereafter, etch the up portion of the isolating structure 40, a portion of the N+ source region 42 and body region 20 to form the trench. Next, implement the ion implantation process at the body region to form the heavy doped region 48 and the metal layer 44 is deposited finally.

Figure 1J:
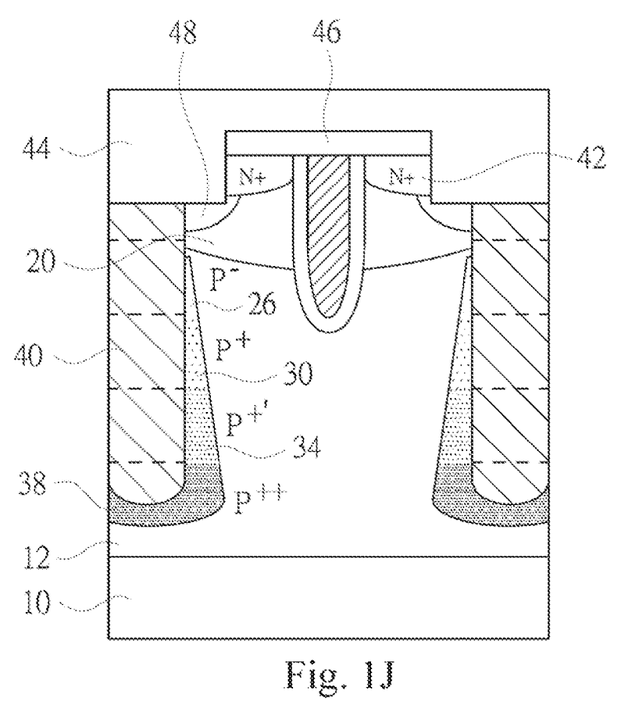

Additionally, as shown the trench power MOSFET structure in the FIG. 1J, the first doped region 26, the second doped region 30, the third doped region 34, and the fourth doped region 38 are all connected, but the present disclosure is not limited thereto. For design requirement, the present disclosure in the doped regions can be connected with each other just in two doped regions. For example, just the third doped region 34 is connected with the fourth doped region 38 and adjacent to the first doped region 26 for a distance, that is, there is no the second doped region 30 between the first doped region 26 and the third doped region 34.

Figure 2:
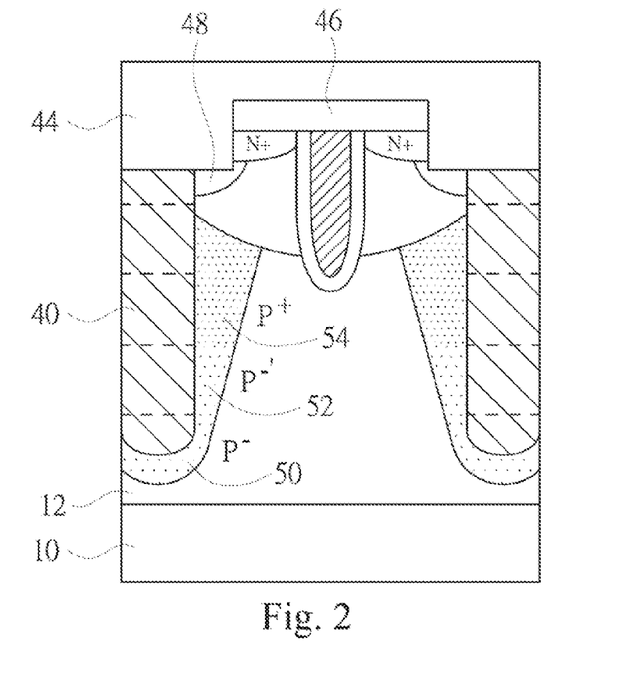
FIG. 2 shows a trench power MOSFET structure in accordance to another embodiment of the present disclosure.

Additionally, in the FIG. 1J, the concentration of the first doped region 26, the second doped region 30, the third doped region 34 and the fourth doped region 38 are light to heavy from the top down to form the trapezoidal junction profile. The FIG. 2 shows another trench power MOSFET structure of present disclosure. The concentrations of the doped regions are heavy to light form up to bottom e.g., the P+ third doped region 54, the P−' second doped region 52, and the P− first doped region 50, to form the inverted, trapezoidal junction profile.

Figure 3:
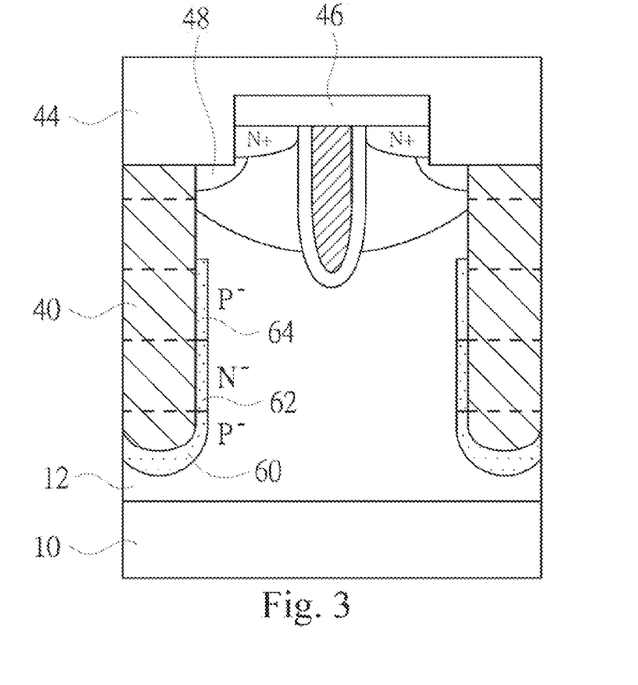
FIG. 3 shows a trench power MOSFET structure in accordance to another embodiment of the present disclosure.

Furthermore, another trench power MOSFET structure of present disclosure as shown in the FIG. 3, the doped regions therein could be made in different conductive type (e.g. P-type and N-type) and different concentration to form the junction profile, e.g., P− third doped region 60, N− second doped region 62 and P− first doped region 64.

Figure 4:
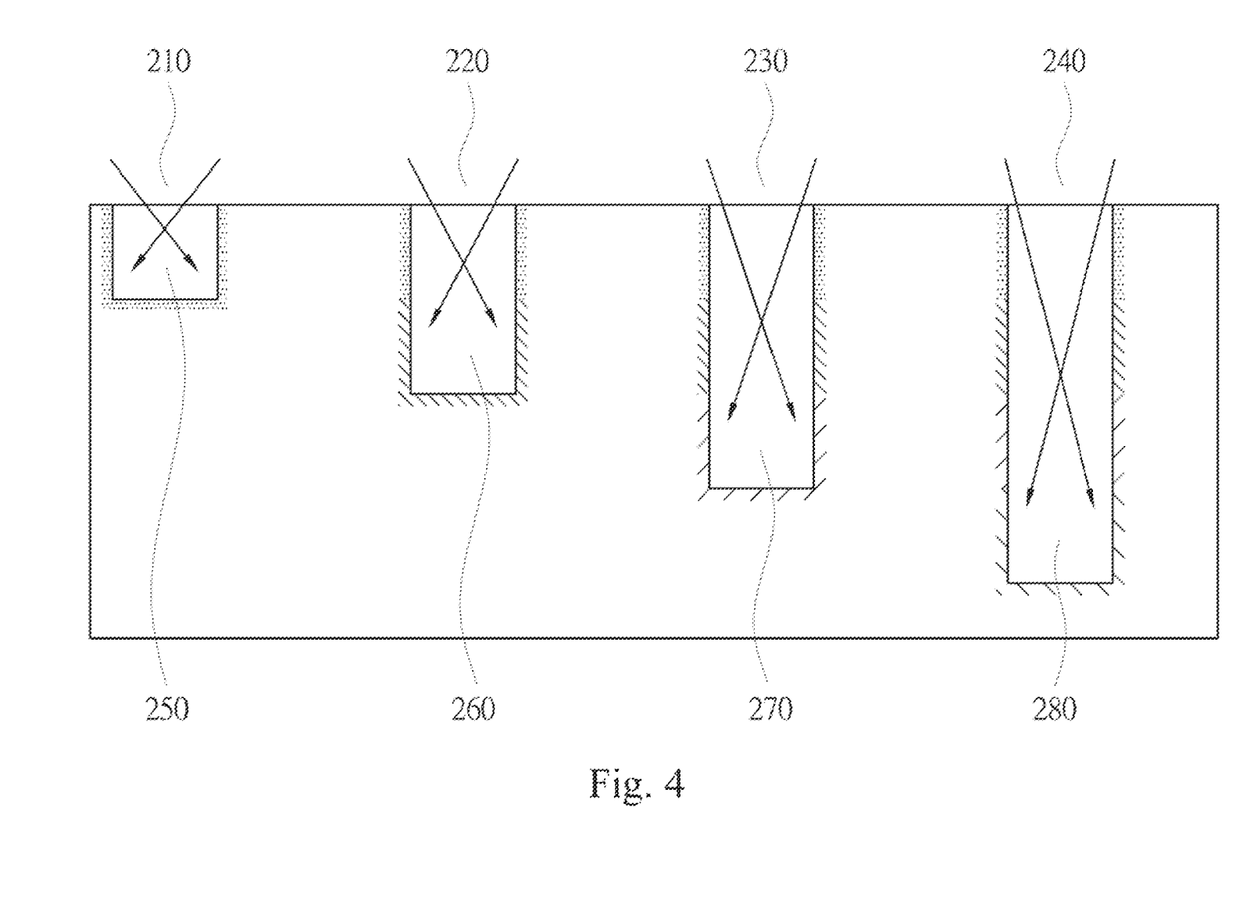
FIG. 4 shows the ion implantation method with angels of trench power MOSFET structure in accordance to another embodiment of the present disclosure.

FIG. 4 shows the fabrication method through ion implantation with angels method of the trench power MOSFET structure in accordance to an exemplary embodiment of present disclosure. As shown in the FIG. 4, four different steps 210, 220, 230, 240 are ion implantation methods with four different, angles to form the doped regions in the different depths 250, 260, 270, 280 of the trench. Above-mentioned step could be implemented after the step in the FIG. 1D and the drive-in process in the FIG. 1E could be omitted. Directly as shown FIG. 1F, form the P− first doped region 26 through ion implantation method with the first angel (ex. step 210), then as shown in FIG. 1G, form the P+ second doped region 30 through ion implantation method with the second angel (ex. step 220), and shown in FIG. 1H, form the P+' third doped region 34 and P++ fourth doped region 38 through ion implantation method with the third and fourth angel (ex. step 230, 240).

Figure 5:
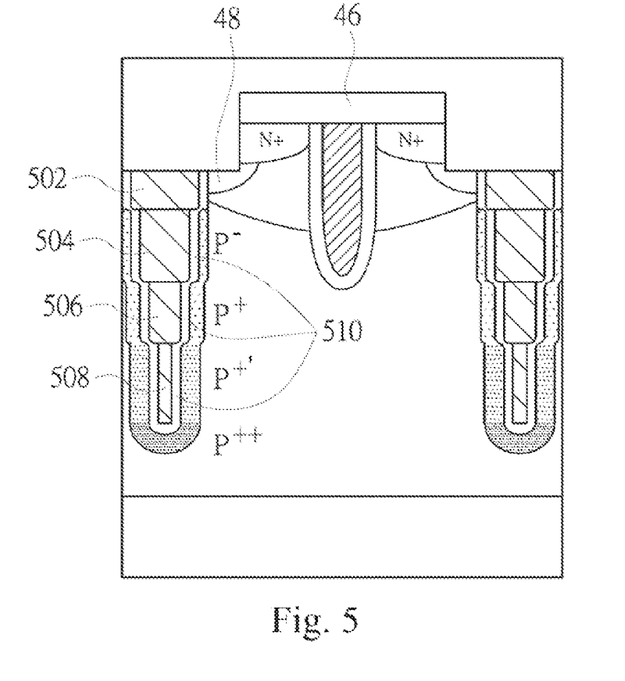
FIG. 5 shows a trench power MOSFET structure in accordance to another embodiment of the present disclosure.

FIG. 5 shows the trench power MOSFET structure in accordance to another embodiment of the present disclosure. The first isolating trench 502, second isolating trench 504, third isolating trench 506, and fourth isolating trench 508 which are formed from the top down have different cross-section area or bottom area, e.g., cross-section area is smaller from the top down. Control different concentration to have doped regions with moderate junction profile. It could be formed a spacer 510 on the inner side wall of the first isolating trench 502, second isolating trench 504, third isolating trench 506, and fourth isolating trench 508. Ether two spacers connected to each other have a portion overlapping. Then, oxide layer or poly is filled in the isolating trench 502,504,506 and 508.

Figure 6:
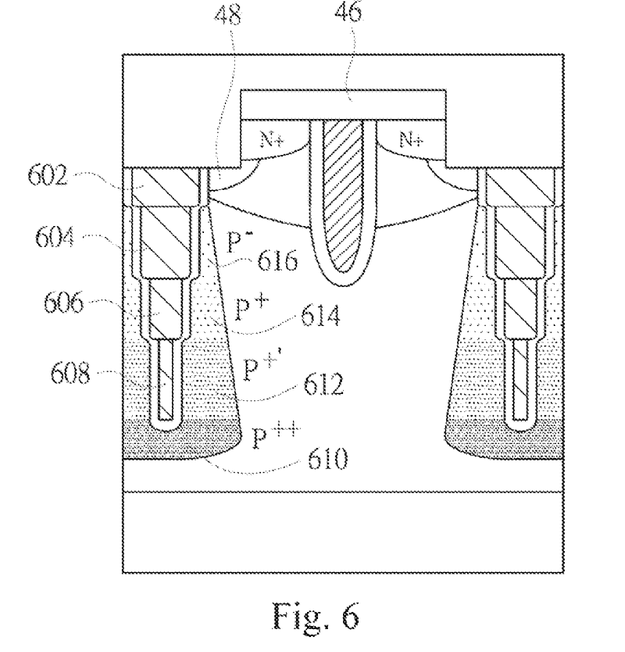
FIG. 6 shows a trench power MOSFET structure in accordance to another embodiment of the present disclosure.

FIG. 6 shows the trench power MOSFET structure in accordance to another embodiment of the present disclosure. As the same in the FIG. 5 is that the cross-section areas of the first isolating trench 602, second isolating trench 604, third isolating trench 606, and fourth isolating trench 608 are different. In this embodiment, the first doped region 616, second doped region 614, third doped region 612, and fourth doped region 610 are controlled the different concentration to form an inverted trapezoidal junction profile with concentration which is light to heavy from the top down.

The trench power MOSFET structure and fabrication method thereof of present disclosure is not limited to active region of termination region. It includes that the junction profile of the trench is made through controlling the concentration of the implanted ions to form at least two connected doped region and repeat before mentioned method to form the junction profile of the trench for changing the width thereof. Accordingly, the charge balance and the electric filed resurf effect could be controlled. The moderate electric filed would be distributed in the trench and around the side wall of the trench. Therefore, the voltage withstanding capability would be increased and conduction loss would be reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A trench power MOSFET structure fabrication method, comprising:
    forming an isolating trench;
    forming two doped regions around the isolating trench, wherein the two doped regions are adjoining and the doping concentrations of two doped regions are different; and
    forming an isolating structure in the isolating trench.

2. A trench power MOSFET structure fabrication method of claim 1, wherein before the step of forming the isolating trench, further comprising:
    forming an epitaxial layer;
    forming a gate trench in the epitaxial layer;
    forming a gate structure in the gate trench; and
    forming a body region outward the gate structure and the isolating trench located outside the body region.

3. A trench power MOSFET structure fabrication method of claim 1, wherein the steps of forming the isolating trench and the two doped regions comprise:
    forming a first isolating trench;
    forming a first doped region located outside the first isolating trench;
    etching the first doped region located in the bottom of the first isolating trench for forming a second isolating trench; and
    forming a second doped region located outside the second isolating trench.

4. A trench power MOSFET structure fabrication method of claim 3, wherein the cross-section area of the first isolating trench is larger than that of the second isolating trench.

5. A trench power MOSFET structure fabrication method of claim 1, wherein the two doped regions is formed in the different locations by the ion implantation with different angles.

6. A trench power MOSFET structure fabrication method of claim 1, wherein the concentrations of the two doped regions are light to heavy from the top down.

* * * * *